United States Patent
Pham et al.

(10) Patent No.: US 8,283,760 B1
(45) Date of Patent: Oct. 9, 2012

(54) LEAD FRAME INTERCONNECT SCHEME WITH HIGH POWER DENSITY

(75) Inventors: Ken Pham, San Jose, CA (US);
Anindya Poddar, Sunnyvale, CA (US);
Ashok S. Prabhu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 102 days.

(21) Appl. No.: 12/760,365

(22) Filed: Apr. 14, 2010

(51) Int. Cl.
*H01L 29/94* (2006.01)
*H01L 23/48* (2006.01)

(52) U.S. Cl. ........... 257/676; 257/23.031; 257/666; 257/690; 257/691; 257/692; 257/696; 257/698; 257/765; 257/763; 257/766; 257/764; 257/737; 257/738; 257/778

(58) Field of Classification Search ........... 257/666; 257/E23.031, 690, 691, 692, 696, 698, 765, 257/763, 766, 764, 737, 738, 778, 676
See application file for complete search history.

(56) References Cited

U.S. PATENT DOCUMENTS

| | | | | |
|---|---|---|---|---|
| 7,612,435 B2 * | 11/2009 | Bayan et al. | ........... | 257/672 |
| 2008/0169537 A1 * | 7/2008 | Kajiwara et al. | ........... | 257/666 |
| 2009/0096100 A1 * | 4/2009 | Kajiwara et al. | ........... | 257/741 |
| 2009/0115035 A1 * | 5/2009 | Bayan et al. | ........... | 257/673 |
| 2009/0174069 A1 * | 7/2009 | Nguyen et al. | ........... | 257/737 |

* cited by examiner

*Primary Examiner* — A O Williams
(74) *Attorney, Agent, or Firm* — Eugene C. Conser; Wade J. Brady, III; Frederick J. Telecky, Jr.

(57) ABSTRACT

An integrated circuit package configured to incorporate a lead frame and methods for its making are is described. The package comprising an IC with aluminum bond pads in communication with circuitry of the die with lead frame with silver bond pads. The package having gold bumps bonded between the aluminum bond pad of the die and the silver bond pad of the lead frame. The package including an encapsulant envelope and including various materials and bond pad structures and constructed in a manner formed by thermosonically or thermocompressionally bonding the gold balls to the bond pads. Also, disclosed are methods of making the package.

11 Claims, 4 Drawing Sheets

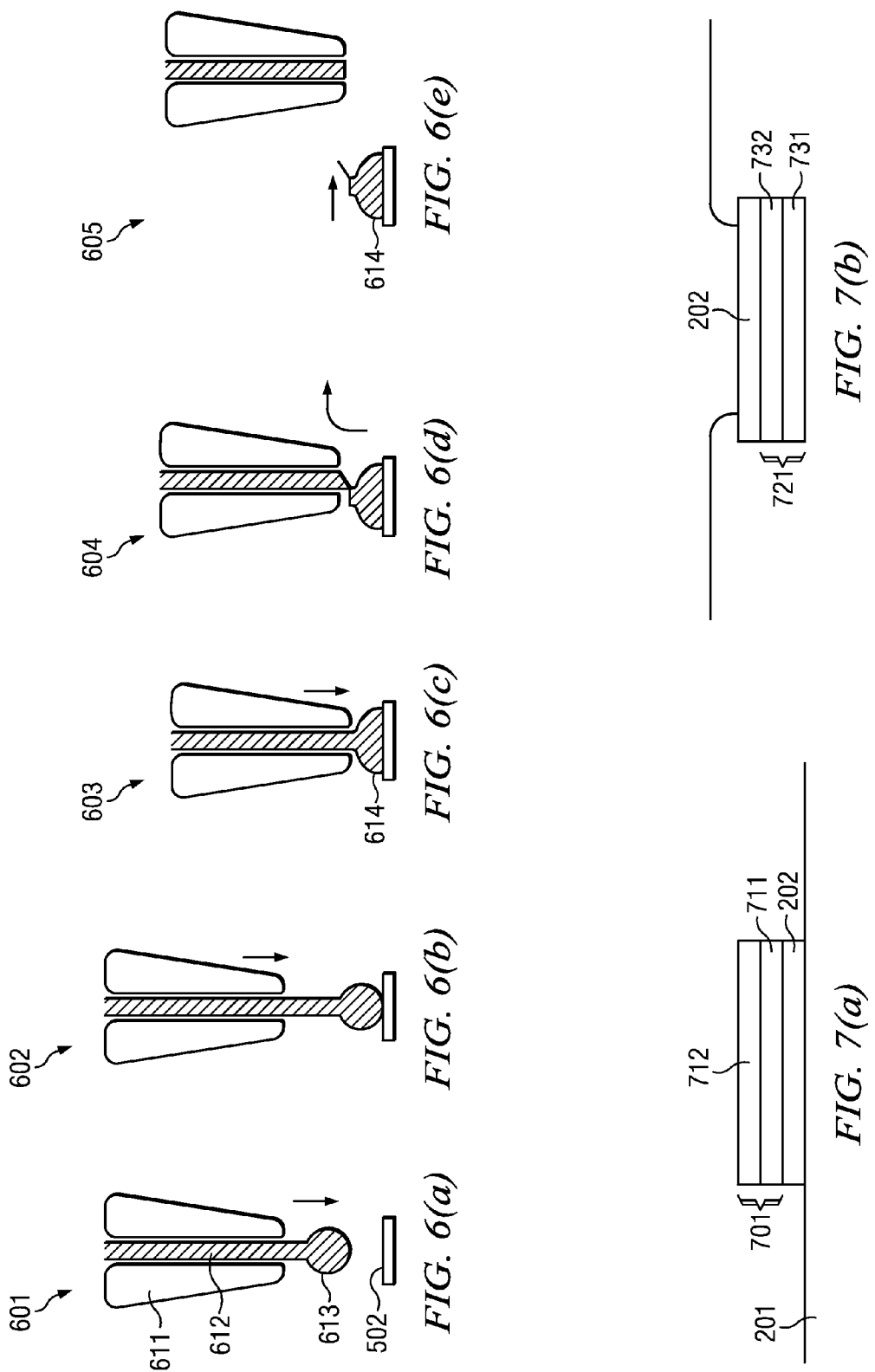

LEAD FRAME INTERCONNECT SCHEME WITH HIGH POWER DENSITY

TECHNICAL FIELD

The present invention relates generally to semiconductor interconnects in lead frame packages. Although not limited to such, the invention includes methodologies, structures, and systems that enable high current capacity packages to be constructed. Also, disclosed are specific electromigration resistant interconnect structures suitable for use in a wide range of or semiconductor packages including, but not limited to power field effect transistor devices and other devices require high current densities and low inductance.

BACKGROUND OF THE INVENTION

Currently, lead frame packages are used in a wide range of electronic device implementations. They have a number of attractive properties that have lead to their wide use in the industry.

Currently, a number of modes are used to bond semiconductor die to their associated lead frames. In one example, a copper lead frame is used and a die with a copper bond pad is used in conjunction with a lead-free solder ball to adhere the die and lead frame. Additionally, such processes require additional UBM (under bump metallurgy) and are not applicable to standard die with aluminum bond pads.

In an effort to address this problem, the current art uses a laminated multi-layer bond pad on the die to enable a lead free solder process. In one example, the aluminum pad of the die is treated with nickel to form a first layer. This nickel layer is then treated with copper to form the final bond pad having a copper bonding surface. Although relatively suitable for use such structures are expensive to manufacture, adding $40-60 to the cost of each wafer.

It is pointed out that this prior art structure suffer from a serious set of problems, which is illustrated schematically by FIGS. 1A & 1B.

FIG. 1A shows a simple figurative illustration of a common solder ball construction. A substrate 102 having several bond pads 103 (in this case say copper pads) has a die 101 mounted thereon. Typically, the die 101 is electrically connected with the substrate 102 (another die, a circuit board, a lead frame, etc.) using a set of solder balls 104 that provide the electrical connections. An example of such balls 104 can be lead-free balls adhered to bond pads 107 of the die. In one example, the solder can be a tin/silver/copper solder. In this example, the balls 104 are a standard 280 μm (micrometer) diameter solder balls. Here the balls 104 are configured with a standard ball pitch of about 500 μm. Dashed line 105 schematically represents a current path through the electrical system depicted. The circled areas 106 represent areas of current crowding. As such, these areas are most vulnerable to the effects of electromigration related circuit failure.

Ordinarily, balls 104 of this type can carry between 1-2 A of current with a relatively low inductance. However, such balls are subject to a number of electromigration related failures. FIG. 1B provides a simple illustration of one such type of failure. This view is an expanded view of an example region 106 of FIG. 1A. These regions are subject to current crowding and attendant high current densities. Over time the ball 104 can separate from the associated bond pad 107. In this depiction the separation 111 slowly restricts the flow of the current to areas of good conduction 112. However, over time the current density increases in region 112. As a result, the rate of electromigration increases. Additionally, as the size of conduction path 112 decreases, the level of current that can be carries tends to decrease. This causes a lowering of the current causing associated circuit elements to fail.

So-called "gold-on-gold" technologies have been in use for some time. These processes require the treatment of die and substrate contacts as well as lead frames to form gold bonding surfaces which are adhered to gold connectors (hence the name "gold-on-gold"). Although reasonably effective as connections, these "gold-on-gold" connectors are not readily usable with standard "off-the shelf" lead frames and IC die. For example, leadframe bonding surfaces must be treated with various intermediate layers to provide the necessary gold bonding surfaces. This is expensive and time consuming, and in some cases, not easily integrate into existing process flows.

It is pointed out that all of these techniques have their shortcomings and have been in existence for decades despite the cost and complexity problems and despite the long recognized need for a better solution. In particular, the industry has been seeking a low cost solution to the problems described above.

Thus, while existing systems and methods work well for many applications, there is an increasing demand for an apparatus and fabrication method that enable the construction of improved flip chip packages and improved lead frame connectors. This disclosure addresses some of those needs.

SUMMARY OF THE INVENTION

In one aspect, an integrated circuit package configured with gold ball (or bump) connectors to a lead frame is described. The package comprises an integrated circuit die configured to include aluminum bond pads. The pads are in electrical communication with circuitry of the die. The package further including a conductive lead frame having a silver bond pad. The package has a gold bump bonded to and positioned between the aluminum bond pad of the die and the silver bond pad of the lead frame. The package includes an encapsulant envelope that encases at least a portion of the conductive lead frame and the die. The package further including various materials and bond pad structures and can be constructed by thermosonically bonding the gold balls to the bond pads.

In another aspect of the invention, a method of forming the package herein is described. The method comprises applying a gold bump to a bonding pad of an integrated circuit die. The bonding pads being in communication with circuitry of the die. Further, positioning a conductive lead frame so that a silver lead frame bond pad is in registry with the gold bump. Further, bonding the gold bump to both the bonding pad of the integrated circuit die and also to the silver bond pad to form an electrical contact between the lead frame and die. The components are then encapsulated such that at least a portion of the die and lead frame to form the completed semiconductor package.

General aspects of the invention include, but are not limited to, integrated circuit packages featuring gold silver lead frame bonds and methods enabling the construction of such devices.

BRIEF DESCRIPTION OF THE DRAWINGS

The invention and the advantages thereof may best be understood by reference to the following description taken in conjunction with the accompanying drawings in which:

FIG. 6 is a series of diagrams illustrating one approach of forming gold balls on a die in accordance with a selected embodiment of the invention.

FIGS. 7A and 7B are simplified illustrations of various embodiments of bond pads and an associated support structure as described in accordance with the principles of the invention In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

Reference is made to particular embodiments of the invention. Examples of which are illustrated in the accompanying drawings. While the invention will be described in conjunction with the particular embodiment, it will be understood that it is not intended to limit the invention to the described embodiment. To the contrary, it is intended to cover alternatives, modifications, and equivalents as may be included within the spirit and scope of the invention as defined by the appended claims.

Aspects of the invention pertain to lead frame packages and methods for their construction.

Figure 1B:
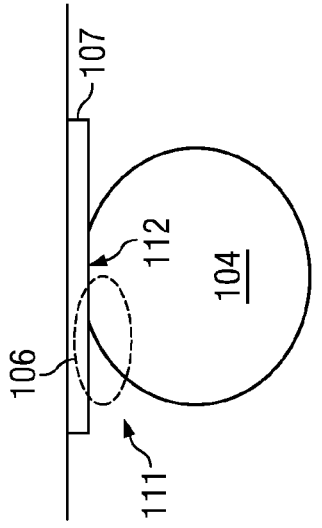
FIGS. 1A & 1B illustrate a simplified illustration of existing solder connections and electromigration problems.
Figure 1A:
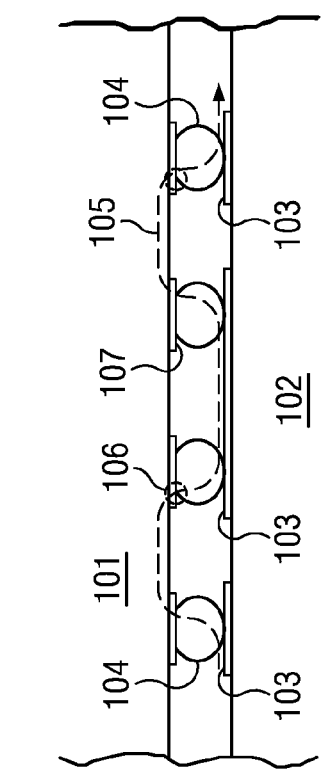
Figure 2:
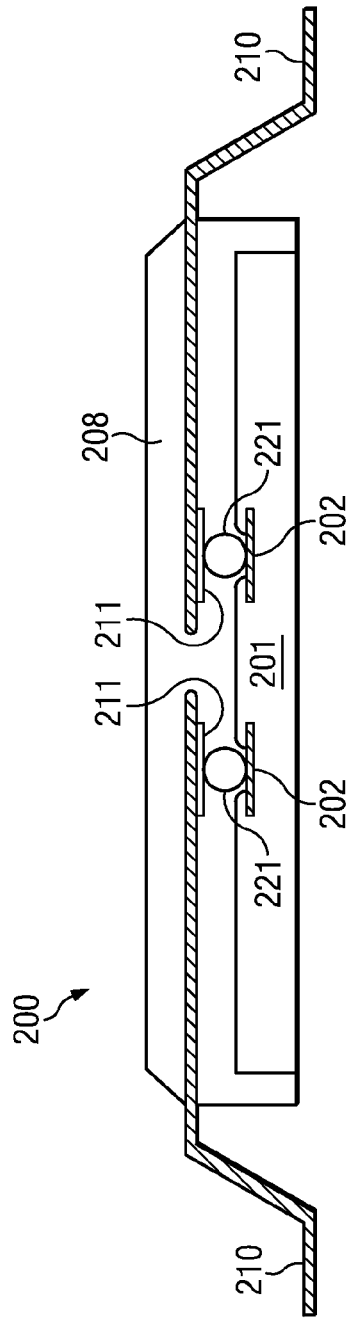
FIG. 2 presents a simplified section view of an embodiment of a package using gold bonds in accordance with the principles of the invention.

In one example, FIG. 2 depicts a highly simplified depiction of a lead frame package constructed in accord with an aspect of the invention. The package 200 includes an integrated circuit die 201. In accordance with the invention the die can be any of a number of different integrated circuits. Such a die can be configured to perform any of a number of functions as can be appreciated by one of ordinary skill. In one embodiment, the depicted package is suitable for high current applications. For example, the package 200 can comprise a power FET device or an array of such devices. As is generally known, most semiconductor devices are very low current devices generally requiring less than 1 Amp for ordinary operation.

However, as stated above, some embodiments of the disclosed device benefit from high current, low impedance applications. For example FETs, Power ICs, High Power Amplifiers, and so on.

The disclosed packages can accommodate high current applications while still providing low impedance and compatible manufacturing. Still more importantly, the presently disclosed embodiments provide a low cost implementation that can be readily integrated into standard process flows with relatively few modifications in existing components or circuit elements. For example, the embodiments of the invention can be used with standard lead frames. Also, standard integrated circuit processing can used to generate the die used in the process. For example, die using standard aluminum bond pads 202 can be readily employed with embodiments of the present invention. These pads 202 are electrically connected with the circuitry of the die. The integrated circuit die 201 includes at least one, but generally an array of many bond pads 202. In this simplified depiction only two such pads are shown, but large arrays of such pads are more commonly used. In this depicted embodiment, the bond pads 202 can be ordinary aluminum bond pads of a type formed in standard semiconductor fabrication process known to those of ordinary skill.

Additionally, the package includes a lead frame 210 that has lead frame bond fingers 211 that are in registry (aligned with) with complementary bond pads 202 of the die. As before, this is a simplified depiction and the inventors contemplate much more complicated structures having many more bond fingers. Importantly, the bond fingers 211 are formed with a layer of silver. In one implementation the lead frame 210 can be a common copper lead frame. The silver pads 211 can be added by ordinary processes commonly employed for such purposes. In one example, the copper lead frame 210 is photomasked such that the bond pad locations are exposed. The lead frame 210 can then be electroplated with silver to form the silver bond pads 211. In other implementations, the pads can be formed using a wide range of other silver deposition or coating processes known to those of ordinary skill. Commonly, a lead frame will be on the order of 200 micrometers thick (generally having a range of about 100 micrometers to about 500 micrometers thick). The silver layer is generally about 0.5 micrometers thick (generally having a range of about 0.01 micrometers to about 5 micrometers thick). The inventors further contemplate that the lead frames are not limited to copper lead frames, but that such lead frames can be made of any conductive material, metals, composites, or other conductive structures.

With continued reference to FIG. 2, gold balls 221 connect the aluminum pads 202 to the silver pads 211. These gold balls 202 can be constructed a good deal smaller than the solder balls used in prior art technologies. For example, a common ball size is on the order of 280 μm which results in a ball pitch of 500 μm or less. This puts an limit on ball density and also on current density. The use of gold balls means that very small balls can be used. The inventors contemplate that balls of in the range of about 20-40 μm in diameter can be used. One particularly useful size includes balls on the order of 1 mil (25 μm) in diameter. Such small diameters can be employed to vastly increase ball density, and due to the excellent conductive properties of gold, vastly increasing potential current density and overall current carrying capacity in the pads. Alternatively, a much smaller connector can be used to carry the same amount of current.

Once the die 201 is electrically connected to the lead frame 210 the bonded structures are encapsulated 208 to form the package. As will be appreciated by those familiar with the art, such encapsulants can include a wide range of encapsulant materials including, but not limited to mold compounds, underfill materials, adhesives and others. Each semiconductor package may be individually molded, or an encapsulant cap may be formed over each two dimensional array of device areas. In arrangements where group molding is done, the encapsulant cap is then cut to singulate the semiconductor packages.

Figure 3A:
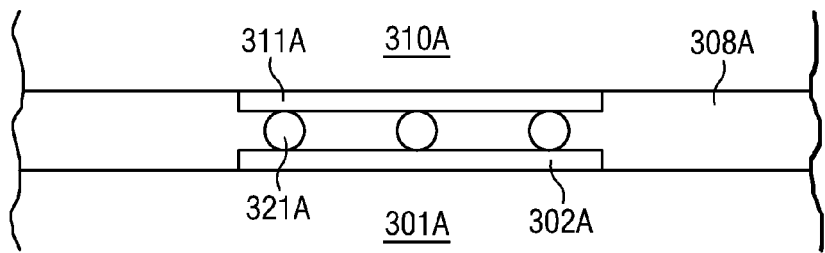
FIGS. 3A & 3B illustrate simplified section views of the portion of a package between the die and the lead frame in accordance with embodiments of the invention.
Figure 3B:
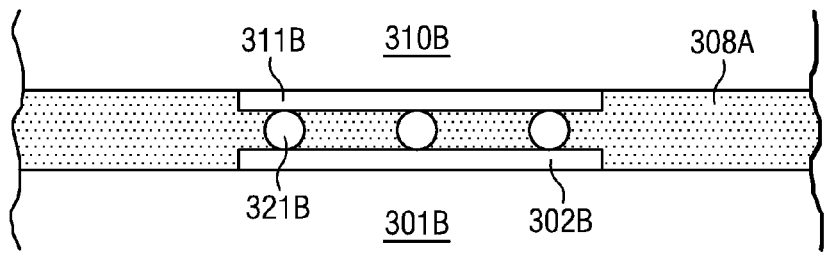

FIGS. 3A and 3B show a few examples of other embodiments of the invention. Using for example standard sized pads such as are depicted in FIG. 2 above, a multiplicity of gold bumps 321A, 321B can be used to electrically interconnect the pads 311A, 311B of the lead frame to associated die pads 302A, 302B. Also, in another implementation a greater density of smaller bond pads can also be employed in accordance with the desired of the design engineers.

Also, the inventors point out that in one embodiment, FIG. 3A shows an advantage of such gold bonds. The inherent strength of such bonds dispenses with the need for underfill materials in the space 308A between a lead frame 310A and a substrate such as IC die 301A. Alternatively, in another embodiment, FIG. 3B shows the same structure treated with underfill materials in the space 308B between a lead frame 310B and a substrate such as IC die 301B. A wide variety of underfill materials can be employed if desired. Epoxies, thermosetting materials and so on. Such materials can be chosen from commonly used underfill encapsulants.

The present invention further includes method embodiments suitable for forming the packages described above. In conjunction with simplified flow diagram of FIG. 4 and associated depictions in FIGS. 5A-D, one example process is now disclosed. For example, the process can begin by providing an integrated circuit or other substrate upon which a lead frame is to be bonded (Step 401). In accordance with one embodiment of the invention, this IC has a multiplicity of bond pads formed thereon. These bonding pads are in communication with the circuitry of the chip. As shown in FIG. 5A, the bond pad(s) 502 of the indicated substrate (here depicted as an IC die) 501 have an aluminum upper bonding surface 503 that is to be bonded with the gold balls.

Figure 5A:
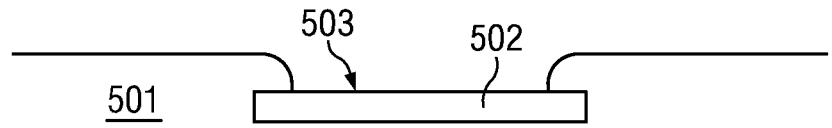
FIGS. 5A-5D provides a series of diagrams that illustrate aspects of the invention also described in FIG. 4.
Figure 5B:
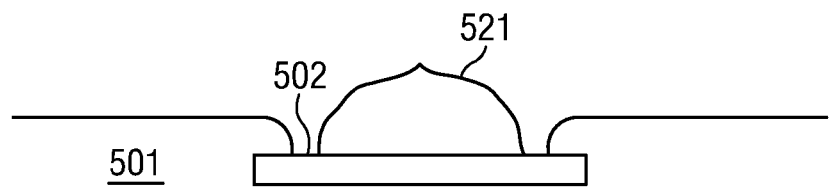

Gold bumps 521 are applied to the bonding pads (Step 403). A number of different approaches can be used to apply the bumps. In one embodiment, a wire bonding machine can be used to make the small gold bumps of the present invention. In one embodiment a 1 mil wire is used as a starting material. Such can be used to form a bump that covers an area of about 25 micron ($\mu$m) by 25 $\mu$m, also approximated by a bump having 25 $\mu$m diameter. FIG. 6 shows a simplified process that can form such bumps. At 601 a wire bonder 611 is positioned over a bond pad 502 of the integrated circuit die. The tip of the bonder having terminal portion 613 of gold wire 612 in position for bonding. The bonding tip and the bonding pad 502 are moved into contact with each other. Contact is made 602 between the terminal portion of gold wire and the bond pad. This is compressed 603 into a gold bump 614. The tip of the wire bonder is lifted away 604 from the gold ball and the tip of the ball is snapped away 605 to complete the formation of the ball 614. As shown in FIG. 5B, the gold ball(s) 521 is positioned on bond pad(s) 502 of the indicated substrate. One example of a suitable tool for forming gold balls in this manner is a Maxum Elite produced by Kulicke & Soffa of Fort Washington, Pa. Gold bumps may also be plated on with various means.

Figure 5C:
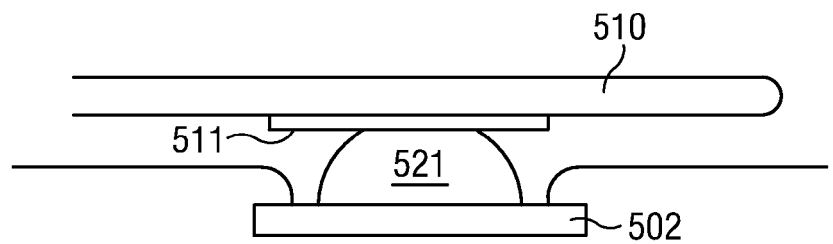

A conductive lead frame is then positioned for attachment to the die (Step 405). The lead frame positioned so that a silver surface of a lead frame bond pad 511 is in alignment (registry) with the gold bump 521. Typically, the positioned bond pad 511 is compressed into contact with the gold ball. As shown in FIG. 5C, the gold ball(s) 521 is positioned on bond pad(s) 502 of the indicated substrate and pressed into contact with an associated silver pad 511.

The gold bump 521 is then bonded to the bonding pad 502 of the integrated circuit die and also to the silver surface of the lead frame bond pad 511 to form an electrical contact between the lead frame and die (Step 407). As will be appreciated by the skilled artisan, many different bonding approaches can be used to achieve this structure. The inventors point out that each 1 mil diameter gold ball can carry the same current as a 280 $\mu$m diameters solder ball. Accordingly, structures using these gold balls can be smaller and carry vastly more current.

Figure 5D:
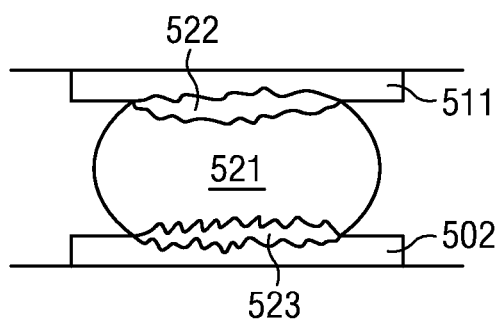

The inventors specifically point out a particularly advantageous approach suitable for bonding the two substrates (501, 510) together. A thermosonic or thermocompression bonding process can be used to generate a solid electromigration resistant bond between the pads (502, 511) and a gold ball 521. In one implementation, FIG. 5D shows one resultant thermosonically bonded structure. In this embodiment, the silver bond pad 511 of the lead frame and the aluminum (or other suitable) bond pad 502 of the IC are subject to a thermosonic bonding process. For example, a process performed by devices like Model 410 Flip Chip Aligner/Bonders, Model 410XP Precision Bonders, Model 860 Omni Bonders, such as are produced by Semiconductor Equipment Corporation having a place of business at Moorpark, Calif. In this depicted embodiment, the thermosonic bonding process produces intermetallic regions at the pad/ball interfaces. For example, at the interface between the gold ball 521 and the silver bond pad 511, a gold-silver intermetallic region 522 can be formed with improved bond strength and higher quality bonds having greater resistance to electromigration problems.

The use of bonding may, in some cases, be enhanced by the presence of a support structure in the integrated circuit that can resist some of the effects of the thermosonic or thermocompression bonding process. Such a support is generally strong and resistant to vibration effects encountered in the bonding process and also resistant to the clamping pressures that hold the die and lead frame together during the bonding process. The point is to protect the underlying circuitry elements from damage during the bonding process.

One such approach is to overlay the aluminum pad 202 (302A, 302B, 502) with a protective support that is still effectively bondable with the gold balls. An example of such a structure is depicted in FIG. 7A. The die 201 includes the standard Aluminum bond pad 202, but is supplemented with a support 701. In the depicted embodiment, the support 701 includes a first layer 711 that is a hard material that is resistant to stress and strong enough to protect the underlying portions of the die from damage induced by thermosonic bonding. A second layer 712 formed over the first to enhance gold bonding properties. Although, such embodiments are more expensive and complex to manufacture, they do provide some advantages. In one embodiment, the first layer 711 is formed using nickel. Nickel layers having a thickness of in the range of about 0.01 um to about 5 um provide Ni layers of sufficient thicknesses. An example of a suitable second layer 712 can be a layer formed of gold material. For example a gold layer 712 having a thickness in the range of about 0.01 um to about 5 um can be used.

In another approach, the aluminum layer can be formed on the protective support. In such a case, existing underlayers can simply be formed of greater thicknesses or of harder materials than are ordinarily used. Referring to FIG. 7B, an underlying support 721 is underneath the aluminum pad 202 (302A, 302B, 502) enabling the aluminum to be bonded with the gold balls. The die 201 includes the standard Aluminum bond pad 202, but is supplemented with a support 701. In the depicted embodiment, the support 721 includes a first layer 731 that is a hard material that is resistant to stress and strong enough to protect the underlying portions of the die from damage induced by bonding. In one example, this material could be a process material like titanium of titanium nitride. Some embodiments use titanium layers having a thickness of in the range of about 100-3000 Å, with one embodiment using a layer about 1000 Å thick. If desired, the titanium layer can be used alone as the support 721. However, in many cases a second layer 732 is formed over the first to provide an improved seed layer (for aluminum layer fabrication) and to provide increased strength. In one example, the second layer 732 can be formed of a titanium nitride material having a thickness of in the range of about 100-2500 Å, with one embodiment using a layer about 2000 Å thick. It should be noted that some degree of thinner materials could be used. On top of these support layers are formed a standard aluminum bond pad 202.

Figure 4:
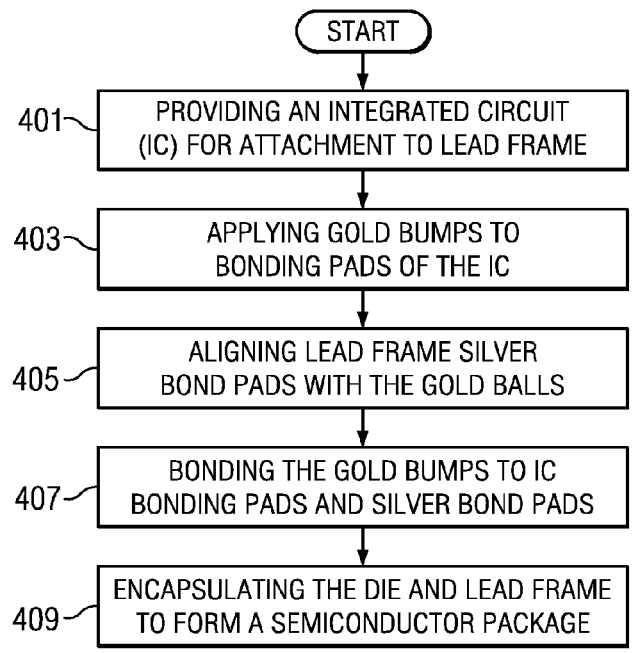
FIG. 4 is a generalized flow diagram describing a method embodiment for fabricating a device in accordance with the principles of the invention.

Returning again to the flow diagram of FIG. 4, at least a portion of the die and lead frame are encapsulated to form a semiconductor package (Step 409). This can comprise any of a number or ordinary encapsulation processes known to those having ordinary skill. A vast array of encapsulants known to persons of ordinary skill in the art can be used. It should be pointed out that underfill encapsulants can be used in the space between die and lead frame, for example, as show in FIG. 3B.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An integrated circuit package comprising;
   an integrated circuit die having an aluminum bond pad in communication with circuitry of the die;
   a conductive lead frame having a silver bond pad;
   a gold bump connecting the aluminum bond pad and the silver bond pad;
   wherein the aluminum bond pad has a support strong enough to prevent damage to the die during the lead frame attachment process; and
   an encapsulant envelope that encases at least a portion of the conductive lead frame and at least a portion of the die.

2. The integrated circuit package recited in claim 1 wherein the conductive lead frame comprises a copper materials having said silver bond pad.

3. The integrated circuit package recited in claim 1 wherein a space between the die and the lead frame is substantially free of underfill material.

4. The integrated circuit package recited in claim 1 wherein an underfill material is introduced into a space between the die and the lead frame.

5. The integrated circuit package recited in claim 1 wherein an interface between the silver bond pad and the gold bump includes a silver gold intermetallic.

6. The integrated circuit package recited in claim 1 wherein an interface between the aluminum bond pad and the gold bump includes an aluminum gold intermetallic.

7. The integrated circuit package recited in claim 1 wherein the support is configured as an underlying support formed under the aluminum bond pad.

8. The integrated circuit package recited in claim 7 wherein the underlying support comprises a titanium layer.

9. The integrated circuit package recited in claim 7 wherein the underlying support comprises a first layer comprised of titanium nitride and a second layer comprised of titanium.

10. The integrated circuit package recited in claim 1 wherein the support is configured as an overlying support formed on top of the aluminum bond pad.

11. The integrated circuit package recited in claim 10 wherein the overlying support comprises a first layer comprised of nickel formed on the aluminum bond pad and a second layer formed of gold and arranged on top of the nickel, the gold having a surface that is bonded to the gold bump.

* * * * *